United States Patent
Chen et al.

(10) Patent No.: US 10,152,083 B2
(45) Date of Patent: Dec. 11, 2018

(54) HEAD MOUNTED ELECTRONIC DEVICE AND HEAD MOUNTED ELECTRONIC DEVICE CUSHION

(71) Applicant: HTC Corporation, Taoyuan (TW)

(72) Inventors: Wei-Jen Chen, Taoyuan (TW); Chih-Lin Chang, Taoyuan (TW)

(73) Assignee: HTC Corporation, Taoyuan (TW)

(*) Notice: Subject to any disclaimer, the term of this patent is extended or adjusted under 35 U.S.C. 154(b) by 246 days.

(21) Appl. No.: 15/054,144

(22) Filed: Feb. 26, 2016

(65) Prior Publication Data
US 2017/0248990 A1    Aug. 31, 2017

(51) Int. Cl.
| | |
|---|---|
| H05K 5/02 | (2006.01) |
| G06F 1/16 | (2006.01) |
| G02B 5/02 | (2006.01) |
| G02B 1/11 | (2015.01) |
| G02B 5/00 | (2006.01) |
| H05K 5/00 | (2006.01) |
| G02B 27/01 | (2006.01) |

(52) U.S. Cl.
CPC ............... *G06F 1/163* (2013.01); *G02B 1/11* (2013.01); *G02B 5/003* (2013.01); *G02B 5/0221* (2013.01); *G02B 27/0176* (2013.01); *G06F 1/1656* (2013.01); *H05K 5/0017* (2013.01); *H05K 5/0217* (2013.01)

(58) Field of Classification Search
CPC .. G02B 27/017; G02B 27/0176; G02B 27/01; H05K 5/0017; H05K 5/0217; G06F 1/1613; G06F 1/163
See application file for complete search history.

(56) References Cited

U.S. PATENT DOCUMENTS

| | | | |
|---|---|---|---|
| 6,691,324 | B1 | 2/2004 | Nakamura |
| 6,763,526 | B1* | 7/2004 | Hong ............... A42B 3/283 |
| | | | 2/171.3 |
| 7,594,280 | B2 | 9/2009 | Lindahl |
| 2002/0181115 | A1 | 12/2002 | Massof et al. |
| 2006/0031978 | A1 | 2/2006 | Pierce |
| 2008/0088529 | A1 | 4/2008 | Tang |
| 2011/0231977 | A1 | 9/2011 | Rupnick et al. |

(Continued)

FOREIGN PATENT DOCUMENTS

| | | |
|---|---|---|
| CN | 203933844 | 11/2014 |
| CN | 204028463 | 12/2014 |

(Continued)

OTHER PUBLICATIONS

English translation of CN 204758917 document.*

(Continued)

*Primary Examiner* — William R Alexander
*Assistant Examiner* — Ephrem Z Mebrahtu
(74) *Attorney, Agent, or Firm* — JCIPRNET

(57) ABSTRACT

A head mounted electronic device includes a casing assembly. The casing assembly includes an inner surface and an outer surface opposite to each other. The inner surface includes at least one inner hole, and the outer surface includes at least one outer hole. The inner hole and the outer hole are connected through and misaligned with each other. The application further discloses a head mounted electronic device cushion.

10 Claims, 4 Drawing Sheets

(56) References Cited

U.S. PATENT DOCUMENTS

| | | | |
|---|---|---|---|
| 2013/0305437 A1* | 11/2013 | Weller | A42B 3/0406 2/422 |
| 2015/0138645 A1 | 5/2015 | Yoo et al. | |
| 2015/0234189 A1 | 8/2015 | Lyons | |
| 2015/0374550 A1 | 12/2015 | Saylor | |
| 2016/0004085 A1 | 1/2016 | Stroetmann | |
| 2016/0018645 A1 | 1/2016 | Haddick et al. | |

FOREIGN PATENT DOCUMENTS

| | | | |
|---|---|---|---|
| CN | 204666934 | | 9/2015 |
| CN | 204758917 | | 11/2015 |
| CN | 204758917 U | * | 11/2015 |
| CN | 105204165 | | 12/2015 |
| CN | 204952205 | | 1/2016 |
| FR | 2944416 | | 10/2010 |
| JP | H06175066 | | 6/1994 |
| JP | H06175099 | | 6/1994 |
| JP | 2002025303 | | 1/2002 |
| TW | M371438 | | 1/2010 |
| WO | 2014082023 | | 5/2014 |

OTHER PUBLICATIONS

"Office Action of Taiwan Counterpart Application", dated Apr. 13, 2017, p. 1-p. 4.

"Office Action of Taiwan Counterpart Application," dated Sep. 28, 2017, p. 1-p. 9.

"Search Report of Europe Counterpart Application", dated Jul. 26, 2017, p. 1-p. 15.

"Office Action of Europe Counterpart Application," dated Dec. 22, 2017, p. 1-p. 10.

"Search Report of Europe Counterpart Application", dated Nov. 30, 2017, p. 1-p. 7.

* cited by examiner

HEAD MOUNTED ELECTRONIC DEVICE AND HEAD MOUNTED ELECTRONIC DEVICE CUSHION

BACKGROUND OF THE APPLICATION

1. Field of the Application

The application relates to an electronic device and an electronic device cushion, and more particularly, to a head mounted electronic device and a head mounted electronic device cushion.

2. Description of Related Art

With the development of technology industries, the styles, the functions and the usages of the electronic devices have become more and more diverse, and thus wearable electronic devices which can be directly worn on a user's body have also been introduced. There are many types of head mounted electronic device; using an eye mask type head mounted electronic device for an instance, after the user wears on this type of electronic device, in addition to seeing a three-dimensional image, the image may also change along with a rotation of the user's head, thereby providing the user with a more immersive feeling.

However, this type of head mounted electronic device may cause the user to feel hot and stuffy, under a long-term wearing because a portion of the head mounted electronic device in contact with the user is prone to produce moisture, possibly, due to sweating or rising in body temperature of the user. Moreover, if the head mounted electronic device can display an image, then in order for the user to have a better experience, light leakage must also be paid attention to during the course of use so as to avoid an influence on image quality.

SUMMARY OF THE APPLICATION

The application provides a head mounted electronic device, which can discharge moisture and has a lower degree of light leakage.

The application provides a head mounted electronic device cushion, which can discharge moisture and has a lower degree of light leakage.

A head mounted electronic device of the application includes a casing assembly, including an inner surface and an outer surface opposite to each other, wherein the inner surface includes at least one inner hole, the outer surface includes at least one outer hole, and the inner hole and the outer hole are connected through and misaligned with each other.

A head mounted electronic device cushion of the application is adapted to be disposed on a head mounted electronic device, and the head mounted electronic device includes an electronic body and a supporting portion connected to the electronic body. The head mounted electronic device cushion is adapted to be disposed on the supporting portion, the head mounted electronic device cushion includes a cushion inner hole and a cushion outer hole located at two opposite sides, and the cushion inner hole and the cushion outer hole are connected through and misaligned with each other.

In view of the above, the head mounted electronic device of the application, with the design of disposing the inner hole and the outer hole respectively on the inner surface and the outer surface of the casing assembly and connecting through the inner hole with the outer hole, enables the moisture to flow from the inner hole, towards the outer hole and to be discharged from the head mounted electronic device when a user wears the head mounted electronic device. Therefore, the user is less likely to feel hot and stuffy. In addition, since the inner hole and the outer hole are misaligned, light is less prone to be directly irradiated into the inner hole from the outer hole, and thus the head mounted electronic device has a lower degree of light leakage. Moreover, the head mounted electronic device cushion of the application has the cushion inner hole and the cushion outer hole, and the design of connecting through the cushion inner hole with the cushion outer hole enables the moisture to flow from the cushion inner hole, towards the cushion outer hole and to be discharged. Therefore, the user is less likely to feel hot and stuffy. Furthermore, since the cushion inner hole and the cushion outer hole are misaligned, light is less prone to be directly irradiated into the cushion inner hole from the cushion outer hole, thereby resulting in a lower degree of light leakage.

In order to make the aforementioned and other features and advantages of the invention comprehensible, several exemplary embodiments accompanied with figures are described in detail below

BRIEF DESCRIPTION OF THE DRAWINGS

The accompanying drawings are included to provide a further understanding of the application, and are incorporated in and constitute a part of this specification. The drawings illustrate embodiments of the application and, together with the description, serve to explain the principles of the invention.

DESCRIPTION OF THE EMBODIMENTS

Figure 1:
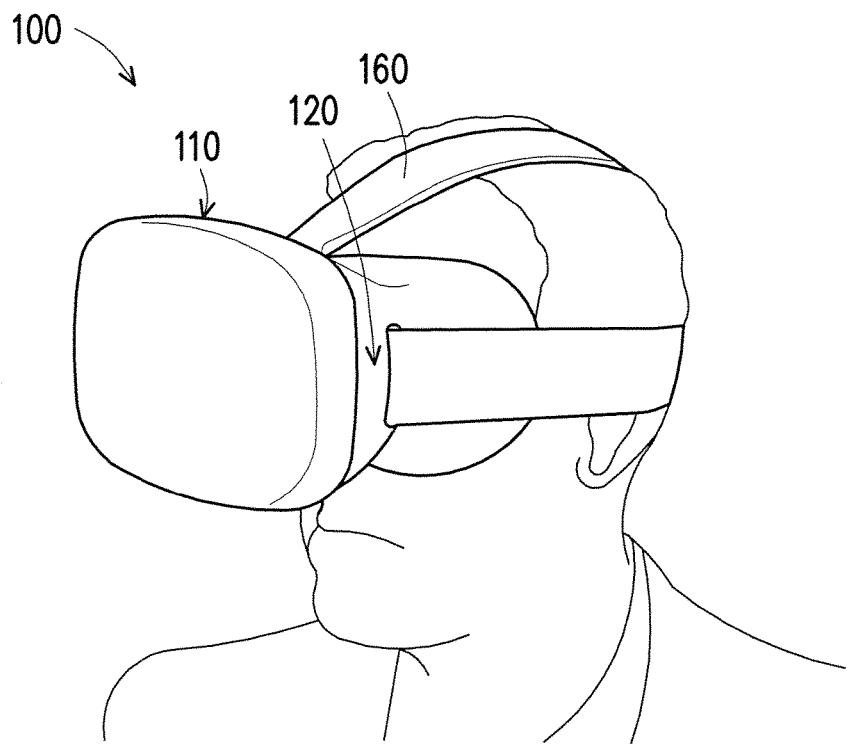
FIG. 1 is a schematic diagram illustrating a head mounted electronic device being worn on a user according to an embodiment of the invention.

FIG. 1 is a schematic diagram illustrating a head mounted electronic device being worn on a user according to an embodiment of the invention. Referring to FIG. 1, the head mounted electronic device 100 of the present embodiment is, for example, an eye mask type electronic device, which can be worn by the user around the eyes and can provide images. Certainly. In other embodiments, the head mounted electronic device 100 may also be other kind of head mounted electronic devices.

The head mounted electronic device 100 of the present embodiment includes an electronic body 110, an extension part 120 and a wearing part 160. In the present embodiment, the electronic body 110 has electronic components such as a display screen (not shown), a circuit board (not shown) and etc. The extension part 120 extends from the electronic body 110 and is adapted to contact the user's face. More specifically, the extension part 120 protrudes out from the edge of the electronic body 110 and appears to form a hollow cover shape. The electronic body 110 is disposed at an end of the extension part 120 while an opposite end of the extension part 120 attaches the user's face. Since a certain distance is required to be maintained between the electronic body 110 and the user's eyes, the length of the extension part 120 is configured to provide this distance and can provide a light shielding effect. The wearing part 160 is fixed at the extension part 120; in the present embodiment, the wearing part 160 is, for example, an elastic band. The head mounted electronic device 100 is fixed on the user's head through the wearing part 160, but the wearing part 160 may also be a cap; and the type of the wearing part 160 is not limited thereto.

As the user wears the head mounted electronic device 100 for a long time, the space between head mounted electronic device 100 and the user's eyes may be accumulated with high moisture due to sweating or rising in body temperature, and thereby causes the user to feel hot and stuffy. In order for the user to experience a more comfortable state of use, the head mounted electronic device 100 of the present embodiment with the following special design enables the moisture accumulated in the space between the head mounted electronic device 100 and the user's eyes to be automatically discharged to the outside. Therefore, the user is less likely to feel hot and stuffy. Detailed descriptions are provided in the following below.

Figure 2:
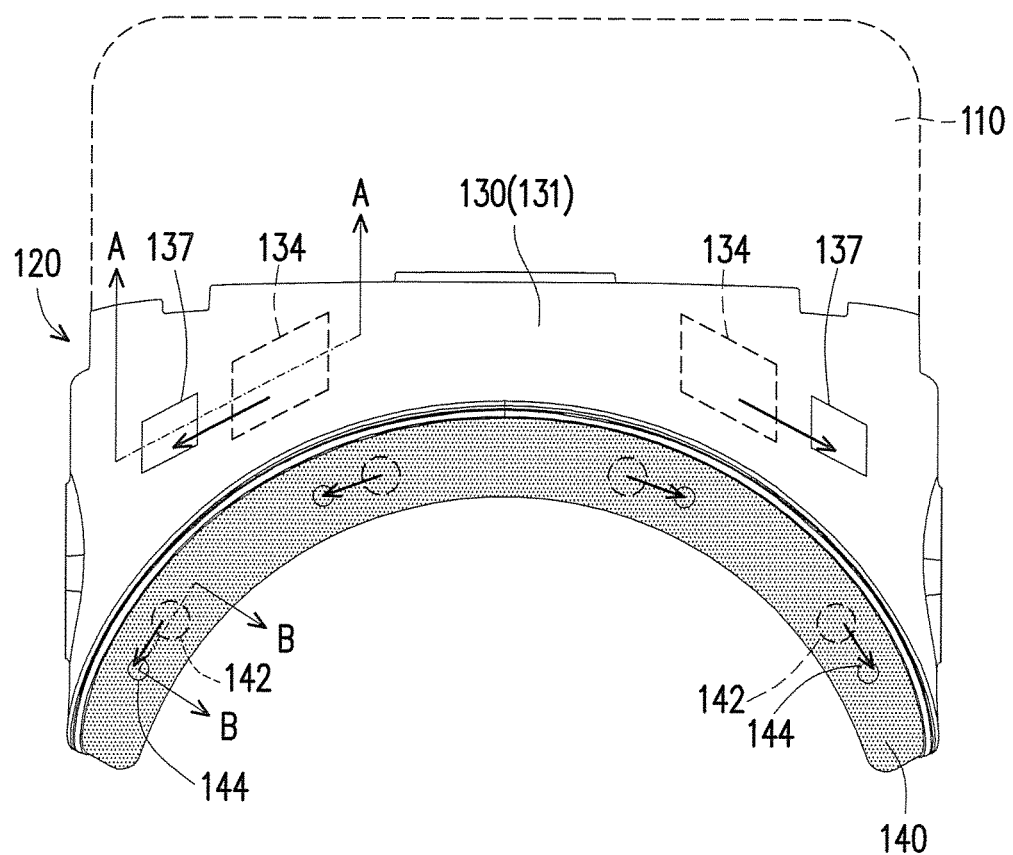
FIG. 2 and FIG. 3 are schematic diagrams respectively illustrating an extension part of the head mounted electronic device of FIG. 1 from different perspectives.
Figure 3:
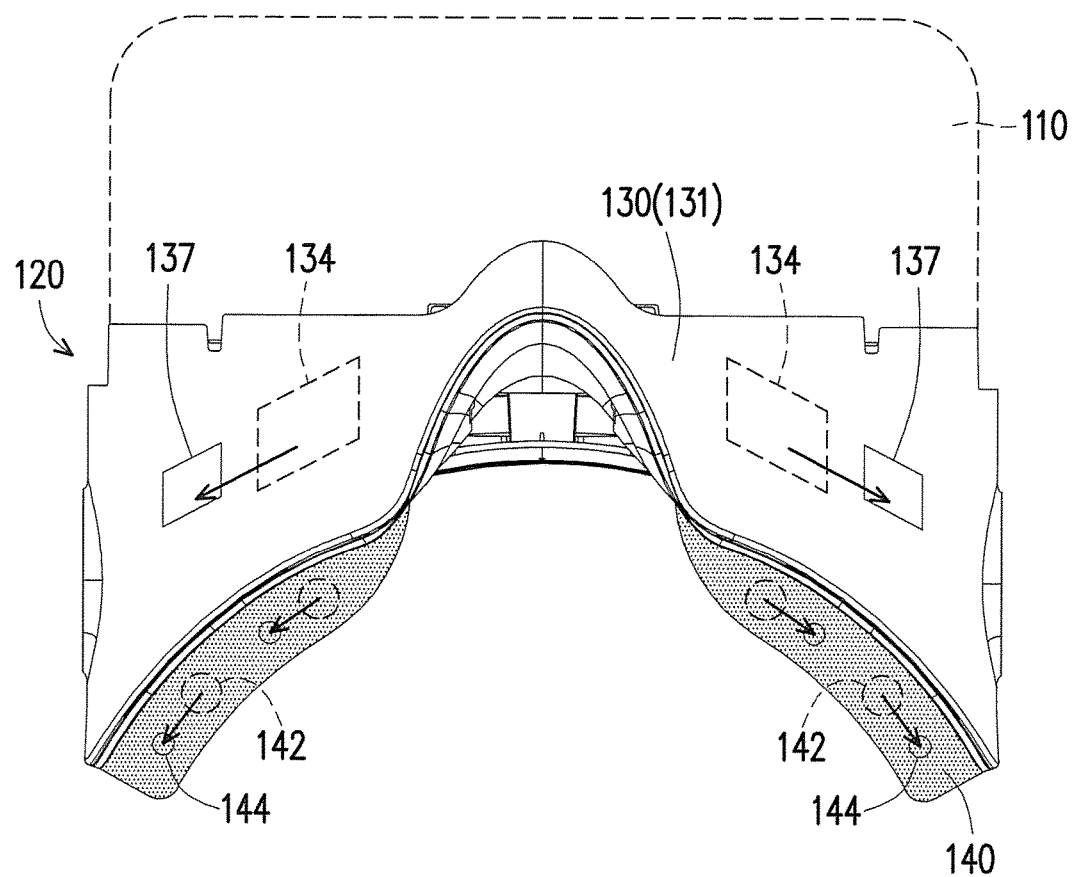

FIG. 2 and FIG. 3 are schematic diagrams respectively illustrating an extension part of the head mounted electronic device of FIG. 1 from different perspectives. Referring to FIG. 2 and FIG. 3, the extension part 120 of the head mounted electronic device 100 of the present embodiment includes a supporting portion 130 connected to the electronic body 110 and a cushion 140 disposed on the supporting portion 130. The supporting portion 130 is formed with a rigid material and is configured to provide a distance between the electronic body 110 and the user's eyes. The cushion 140 is configured to contact the user's face. It is to be noted that, FIG. 2 and FIG. 3 schematically illustrate the electronic body 110 with dashed-lines so as to facilitate the understanding of the extension part 120 from different perspectives. More specifically, the extension part 120 of FIG. 2 is provided from a perspective of being viewed from the above after being worn by the user, as shown in FIG. 1, such that the cushion 140 as seen in FIG. 2 is in contact with the user's forehead; and the extension part 120 of FIG. 3 is provided from a perspective of being viewed from the below after being worn by the user, as shown in FIG. 1, such that the cushion 140 as seen in FIG. 3 is in contact with the user's cheek on both sides of the nose.

Figure 4:
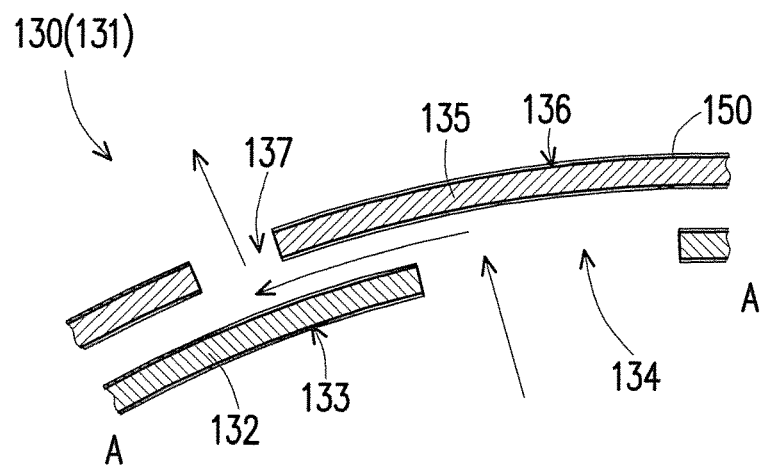
FIG. 4 is a schematic cross-sectional diagram illustrating a supporting portion of the extension part of FIG. 2 along a section-line A-A.

FIG. 4 is a schematic cross-sectional diagram illustrating a supporting portion of the extension part of FIG. 2 along a section-line A-A. It is to be noted that, FIG. 4 only schematically illustrate a portion of the supporting portion of the extension part to demonstrate that this section of the supporting portion of the extension part includes two layers of casing body. Referring to FIG. 2, FIG. 3 and FIG. 4, in the present embodiment, the supporting portion 130 of the extension part 120 includes a casing assembly 131. The casing assembly 131 includes an inner casing 132 and an outer casing 135 covering outside the inner casing 132 and spaced a distance apart from the inner casing 132, the inner casing 132 and the outer casing 135 respectively include an inner surface 133 and an outer surface 136 opposite to each other. The inner surface 133 includes at least one inner hole 134, the outer surface 136 includes at least one outer hole 137, and the inner hole 134 and the outer hole 137 are connected through with each other. More specifically, in the present embodiment, the inner casing 132 includes a plurality of inner holes 134, the outer casing 135 includes a plurality of outer holes 137, and the inner holes 134 are connected through with the outer holes 137.

It can be known from the theory of fluid mechanics and mass conservation, in which the aperture area is inversely proportional to the fluid flow rate and the sums of power, potential energy and kinetic energy of the fluid pressures at different locations are equal, under the condition that the potential energy does not change, the pressure at the smaller aperture area is lesser. Therefore, in the present embodiment, an area of the inner holes 134 is greater than an area of the outer holes 137; when the user wears on the head mounted electronic device 100 of the present embodiment, the user may cause a space surrounded by the electronic body 110, the extension part 120 and the human face to have higher moisture due to sweating or rising in body temperature, and under this condition, the moisture can automatically flow from the inner holes 134 of the inner casing 132 towards the outer holes 137 of the outer casing 135 and then leave the head mounted electronic device 100, so as to lower the humidity in the space surround by the electronic body 110, the extension part 120 and the human face. It can be known from the experience that, a head mounted electronic device of the conventional technology, which does not configure a plurality of inner holes and a plurality of outer holes connected through with each other in the casing assembly, will reach a humidity of up to 98% under a long-term wearing; whereas, the head mounted electronic device 100 of the present embodiment will only reach a humidity of up to 78% under the long-term wearing. Therefore, the head mounted electronic device 100 of the present embodiment can effectively enables the humidity of the space covering on the human face to be maintained under a certain percentage, thereby providing the user with a more comfortable state of use. Certainly, in other embodiments, the area of the inner holes 134 may also be smaller than or equal to the area outer holes 137, and this may also enable the moisture to flow from the inner holes 134 of the inner casing 132 towards the outer holes 137 of the outer casing 135 and to leave the head mounted electronic device 100, and thereby achieve the effect of lowering the humidity in the space surrounded by the electronic body 110, the extension part 120 and the human face.

In the present embodiment, the number of the inner holes 134 corresponds to the number of the outer holes 137, but in other embodiments, the number of the inner hole 134 may also not correspond to the number of the outer holes 137 such that the moisture passing through the inner hole 134 will move towards the nearby outer holes 137.

It is worth mentioning that, since the electronic body 110 of the head mounted electronic device 100 of the present embodiment can display image, in order to provide the user with better experience, light leakage must also be paid attention to during the course of use so as to avoid an influence on the image quality. Therefore, in order to reduce the outside light from directly entering into the head mounted electronic device due to the casing assembly 131 being configured with the inner holes 134 and the outer holes 137, in the present embodiment, positions of the inner holes 134 and the outer holes 137 are misaligned. That is, projection regions of the inner holes 134 on the outer casing 135 do not overlap with the positions of the outer holes 137.

In addition, in the present embodiment, as shown in FIG. 4, the head mounted electronic device 100 further includes a light absorbing coating layer 150 coated on the casing assembly 131. More specifically, the light absorbing coating layer 150 is coated on an outer surface and the inner surface 133 of the inner casing 132 and the outer surface 136 and an inner surface of the outer casing 135. The light absorbing coating layer 150 may be a black paint or a dark color paint so as to lower a reflectance of the light. In addition, a surface texture of the light absorbing coating layer 150 may be rough so as to enable the light to travel in a diffusive manner even if being reflected, thereby lowering a chance for the light to enter into the inner casing 132.

Figure 5:
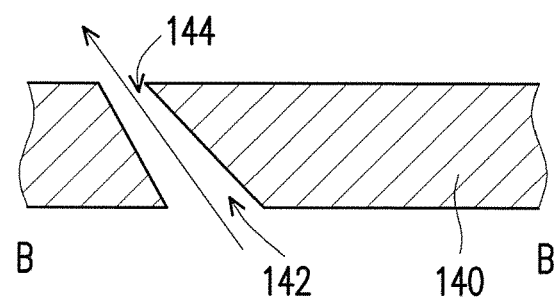
FIG. 5 is a schematic cross-sectional diagram illustrating a cushion of the extension part of FIG. 2 along a section-line B-B.

FIG. 5 is a schematic cross-sectional diagram illustrating a cushion of the extension part of FIG. 2 along a section-line B-B. Referring to FIG. 2, FIG. 3 and FIG. 5, in the present embodiment, in addition to the casing assembly 131 of the supporting portion 130 including the inner holes 134 and the outer holes 137, the cushion 140 also includes at least one cushion inner hole 142 and at least one cushion outer hole 144 at two opposite sides, as shown in FIG. 5, and the cushion inner hole 142 and the cushion outer hole 144 are connected through and misaligned with each other. In the present embodiment, an area of the cushion inner hole 142 is greater than an area of the cushion outer hole 144. Similarly, the head mounted electronic device 100 of the present embodiment, by configuring the cushion inner hole 142 and the cushion outer hole 144, which are connected through with each other and having different areas, on the cushion 140, enables the moisture to automatically flow from the cushion inner hole 142, through the cushion 140 and towards the cushion outer hole 144 so as to leave the head mounted electronic device 100, and thus effectively prevent the humidity of the space between the head mounted electronic device 100 and the human face covered thereby from continuing to rise.

Certainly, in other embodiments, the area of the cushion inner hole 142 may also be smaller than or equal to the area of the cushion outer hole 144, and this configuration may also achieve the effect of enabling the moisture to flow from the cushion inner hole 142, pass through the cushion 140 and towards the cushion outer hole 144 so as to leave the head mounted electronic device 100. In addition, the color of the cushion 140 is black or dark color so as to lower the reflectance of light. The surface texture of the cushion 140 can be rough so that light can travel in a manner of diffusion even if being reflected, thereby lowering the chance for the light to pass through the cushion 140. It is note worthily that, in other embodiments, the electronic body or the supporting portion of the head mounted electronic device may also do not have the inner hole and the outer hole, and only use the cushion inner hole 142 and the cushion outer hole 144 of the cushion 140 to achieve the effect of discharging moisture.

It is to be noted that, the numbers, the shapes and the locations of the inner hole 134, the outer hole 137, the cushion inner hole 142 and the cushion outer hole 144 are not to be limited by the drawings; the user may adjust the numbers, the shapes and the locations of the inner hole 134, the outer hole 137, the cushion inner hole 142 and the cushion outer hole 144 according to the needs and an actual shape of the casing body.

In addition, the cushion 140 can be assembled onto the supporting portion 130 by means of using Velcro or fastener. Thus, the user can detach the cushion 140 to perform cleaning.

It is worth mentioning that, although in the present embodiment, the casing assembly 131 is constituted by the inner casing 132 and the outer casing 135 which are separated, but in other embodiments, the casing assembly may also have one single casing body, wherein the inner surface and the outer surface of the casing assembly are respectively the two opposite surfaces of the casing body. The inner surface and the outer surface of the casing body respectively have the inner holes and the outer holes that are misaligned, and the area of the inner holes is greater than the area of the outer hole. The form of the casing assembly is not limited to only the ones described in the above.

Moreover, in other embodiments, the electronic body 110 of the head mounted electronic device 100 may also include the aforesaid casing assembly 131 which has the inner holes 134 and the outer holes 137, that is, the head mounted electronic device 100, in addition to the extension part 120, may further have inner holes 134 and the outer holes 137, which are connected through and misaligned with each other, on the electronic body 110, so as to provide more pathways for discharging the moisture.

In summary, the head mounted electronic device, with the design of disposing the inner holes and the outer holes respectively on the inner surface and the outer surface of the casing assembly and connecting through the inner holes with the outer holes, enables the moisture to flow from the inner hole, towards the outer hole and to be discharged from the head mounted electronic device when the user wears the head mounted electronic device. Therefore, the user is less likely to feel hot and stuffy. In addition, since the inner holes and the outer holes are misaligned, the light is less prone to be directly irradiated into the inner holes from the outer holes, and thus the head mounted electronic device has a lower degree of light leakage. Moreover, the head mounted electronic device cushion of the application has the cushion inner hole and the cushion outer hole, and the design of connecting through the cushion inner hole with the cushion outer hole enables the moisture to flow from the cushion inner hole, towards the cushion outer hole and to be discharged. Therefore, the user is less likely to feel hot and stuffy. Furthermore, since the cushion inner hole and the cushion outer hole are misaligned, light is less prone to be directly irradiated into the cushion inner hole from the cushion outer hole, thereby resulting in a lower degree of light leakage.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A head mounted electronic device, comprising:
a casing assembly, comprising an inner surface and an outer surface opposite to each other, wherein the inner surface comprises at least one inner hole, the outer surface comprises at least one outer hole, and the at least one inner hole and the at least one outer hole are connected through and misaligned with each other;
an electronic body; and
an extension part, extending from the electronic body and adapted to contact a user, at least one of the electronic body and the extension part comprises the casing assembly,
wherein the extension part protrudes out from the edge of the electronic body and appears to form a hollow cover shape, and the at least one inner hole and the at least one outer hole are located on the extension part,
wherein the extension part comprises a supporting portion connected to the electronic body and a cushion disposed on the supporting portion, the cushion is adapted to contact a face of the user, and the supporting portion comprises the at least one inner hole and the at least one outer hole, wherein an area of the at least one inner hole is greater than an area of the at least one outer hole.

2. The head mounted electronic device as recited in claim 1, wherein the cushion comprises a cushion inner hole and a cushion outer hole located at two opposite sides, and the cushion inner hole and the cushion outer hole are connected through and misaligned with each other.

3. The head mounted electronic device as recited in claim 2, wherein an area of the cushion inner hole is greater than an area of the cushion outer hole.

4. The head mounted electronic device as recited in claim 1, wherein the casing assembly comprises an inner casing and an outer casing covering outside the inner casing and spaced a distance apart from the inner casing, the inner surface of the casing assembly is located at the inner casing, and the outer surface of the casing assembly is located at the outer casing.

5. The head mounted electronic device as recited in claim 1, wherein the casing assembly comprises a casing body, and the inner surface and the outer surface of the casing assembly are respectively two opposite surfaces of the casing body.

6. The head mounted electronic device as recited in claim 1, wherein the inner casing comprises a plurality of the inner holes, the outer casing comprises a plurality of the outer holes, the inner holes are connected through with the outer holes, and the number of the inner holes corresponds to the number of the outer holes.

7. The head mounted electronic device as recited in claim 1, wherein the inner casing comprises a plurality of the inner hole, the outer casing comprises a plurality of the outer holes, the inner holes are connected through with the outer holes, and the number of the inner holes does not correspond to the number of the outer hole.

8. The head mounted electronic device as recited in claim 1, further comprising:
a light absorbing coating layer, coated on the casing assembly.

9. The head mounted electronic device as recited in claim 8, wherein the casing assembly comprises an inner casing and an outer casing covering outside of the inner casing and spaced a distance apart from the inner casing, the inner surface of the casing assembly is located at the inner casing, the outer surface of the casing assembly is located at the outer casing, and the light absorbing coating layer is coated on an outer surface and the inner surface of the inner casing and on the outer surface and an inner surface of the outer casing.

10. A head mounted electronic device cushion, adapted to be disposed on a head mounted electronic device, the head mounted electronic device comprising an electronic body and a supporting portion connected to the electronic body, the head mounted electronic device cushion adapted to be disposed on the supporting portion and to contact a face of a user with an inner side surface thereof, and the head mounted electronic device cushion comprising:
a cushion inner hole located at the inner side surface of the head mounted electronic cushion and a cushion outer hole located at an outer side surface of the head mounted electronic cushion, the inner side surface being opposite to the outer side surface, the cushion inner hole and the cushion outer hole being connected through and misaligned with each other, wherein an area of the cushion inner hole is greater than an area of the cushion outer hole.

* * * * *